United States Patent
Otaka et al.

(10) Patent No.: US 9,254,661 B2
(45) Date of Patent: Feb. 9, 2016

(54) LIQUID EJECTING HEAD MANUFACTURING METHOD AND LIQUID EJECTING HEAD

(71) Applicant: CANON KABUSHIKI KAISHA, Tokyo (JP)

(72) Inventors: Shimpei Otaka, Kawasaki (JP); Isao Imamura, Kawasaki (JP); Hiroyuki Shimoyama, Kawasaki (JP); Tomohiro Takahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/604,957

(22) Filed: Jan. 26, 2015

(65) Prior Publication Data

US 2015/0217569 A1 Aug. 6, 2015

(30) Foreign Application Priority Data

Feb. 3, 2014 (JP) .................. 2014-018675

(51) Int. Cl.
  *B41J 2/16* (2006.01)
  *H05K 3/32* (2006.01)
  *H05K 3/28* (2006.01)
  *H05K 1/18* (2006.01)

(52) U.S. Cl.
  CPC ............ *B41J 2/164* (2013.01); *H05K 3/281* (2013.01); *H05K 1/182* (2013.01); *H05K 2201/10977* (2013.01); *H05K 2203/0195* (2013.01); *H05K 2203/049* (2013.01)

(58) Field of Classification Search
  CPC ...... B41J 2/1623; B41J 2/1628; B41J 2/1631; B41J 2/1639; B41J 2/1642
  USPC ........................................................ 347/44
  See application file for complete search history.

(56) References Cited

U.S. PATENT DOCUMENTS

| 7,533,960 B2 | 5/2009 | Yasuda et al. |
| 2007/0139469 A1* | 6/2007 | Yasuda et al. ............ 347/42 |

FOREIGN PATENT DOCUMENTS

JP 2008-120056 A 5/2008

* cited by examiner

*Primary Examiner* — Manish S Shah
*Assistant Examiner* — Roger W Pisha, II
(74) *Attorney, Agent, or Firm* — Fitzpatrick, Cella, Harper & Scinto

(57) ABSTRACT

Precise positioning of a film used to seal an electrical connection on a liquid ejecting head is made possible. Specifically, positioning is conducted in a state in which part of the film is held to a finger by suction. Next, the finger is moved downward while in the positioned state, and part of the film is pressed against a wiring board. With part of the film fixed to the wiring board in this way, a sealing resin flows while being covered by the film. Consequently, shifting of the position of the film as the sealing resin flows may be prevented. As a result, it becomes possible to conduct covering with the film in a precisely positioned state.

20 Claims, 16 Drawing Sheets

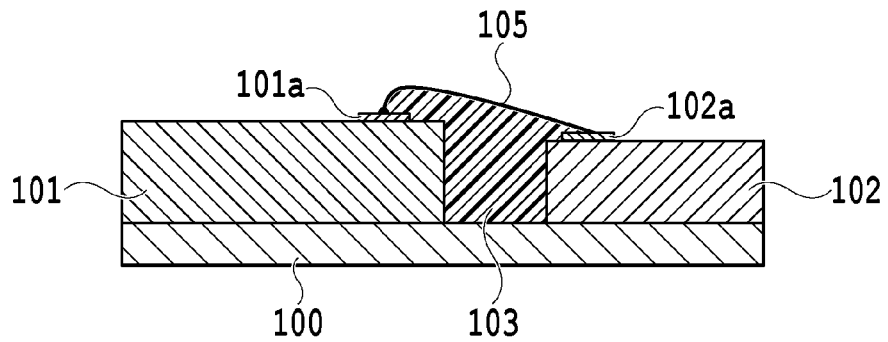
FIG.3A
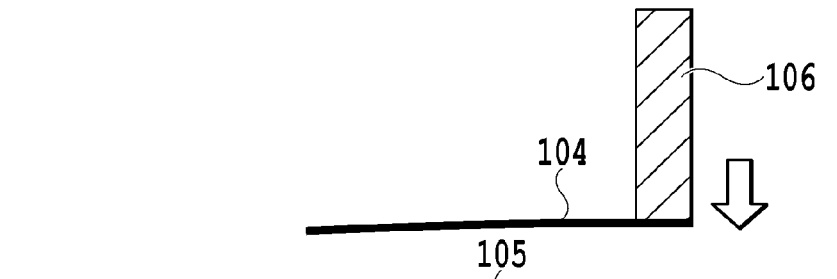
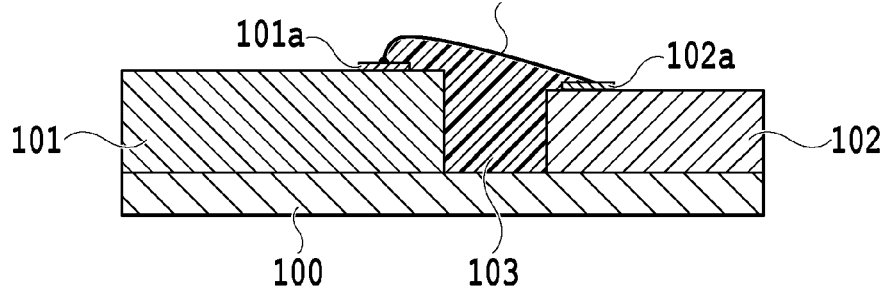
FIG.3B
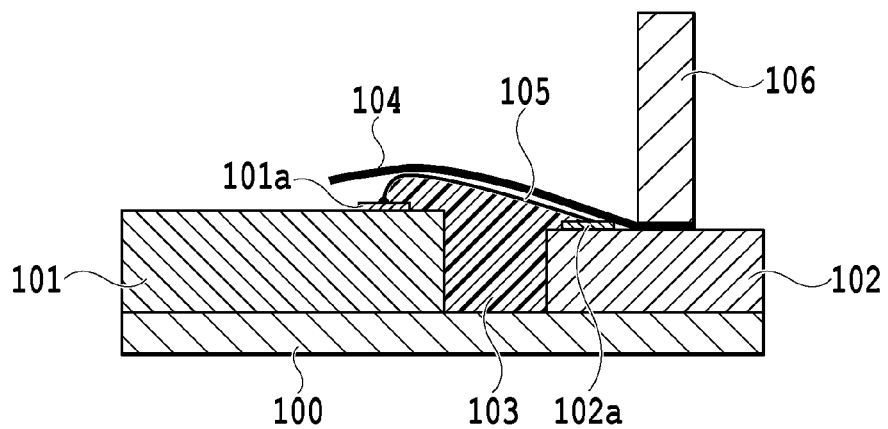
FIG.3C

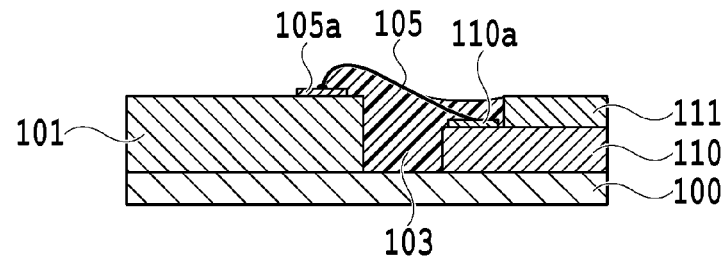
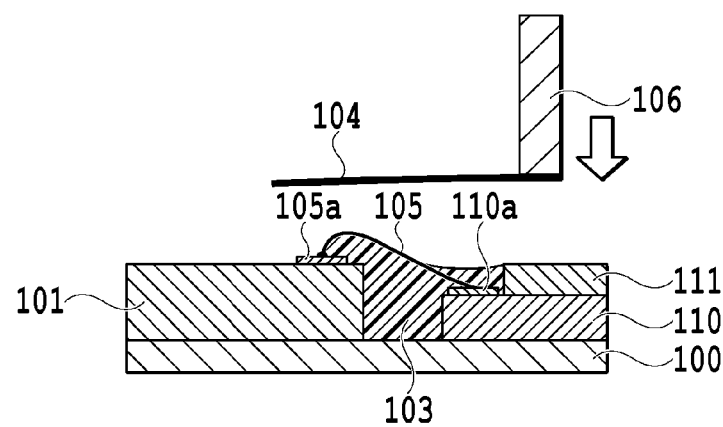
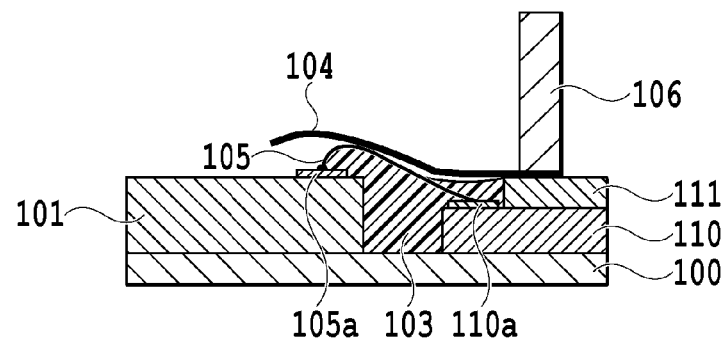
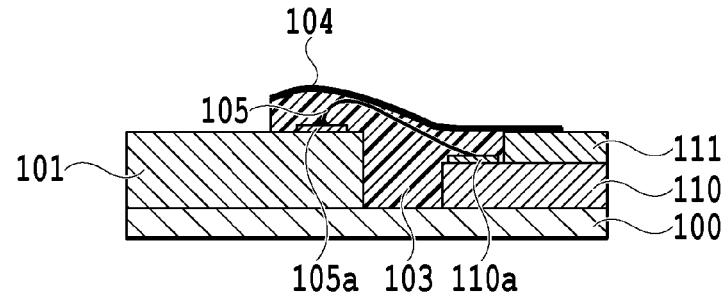

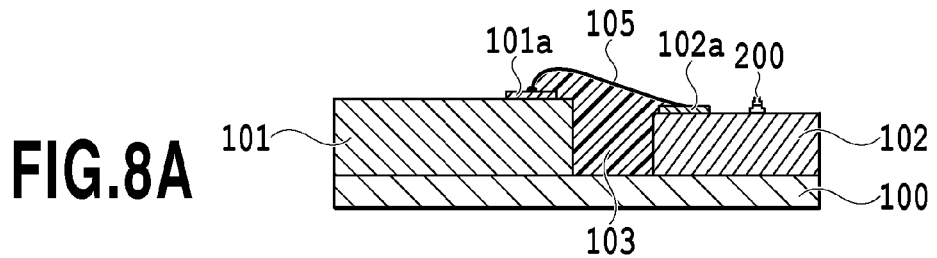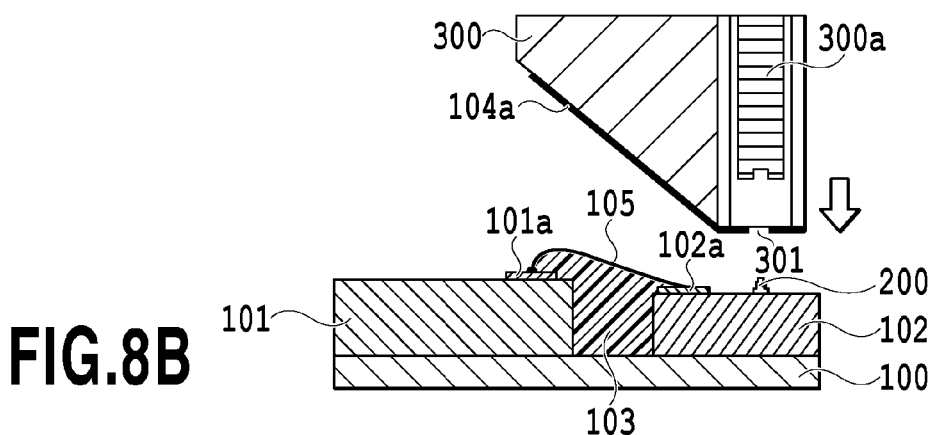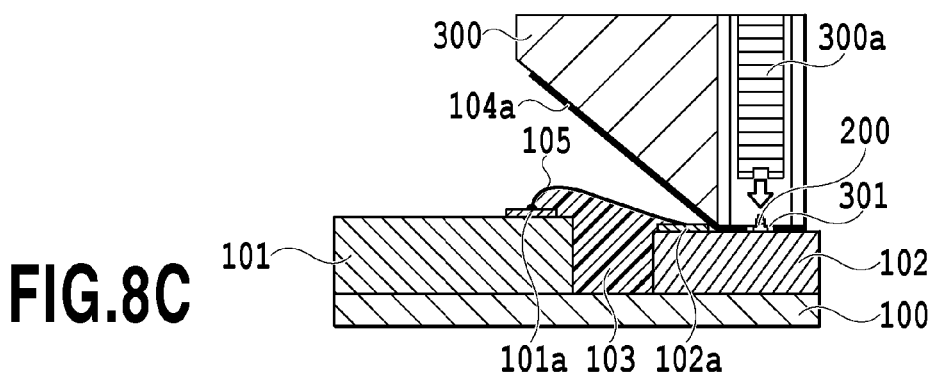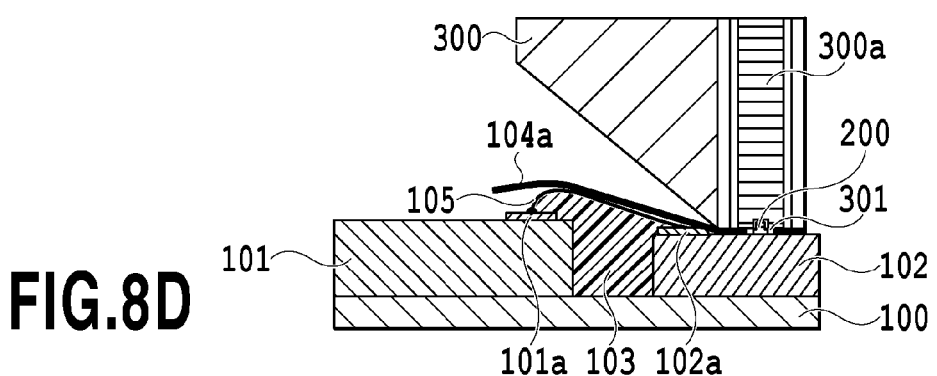

LIQUID EJECTING HEAD MANUFACTURING METHOD AND LIQUID EJECTING HEAD

BACKGROUND OF THE INVENTION

1. Field of the Invention

The present invention relates to a method of manufacturing a liquid ejecting head that ejects a liquid such as ink, and a liquid ejecting head, and more particularly, relates to a technology that covers an electrical connection between a printing element substrate constituting the liquid ejecting head and an electrical wiring with a film for sealing the electrical connection.

2. Description of the Related Art

In the related art, a technology is known which seals an electrical connection between a printing element substrate and an electrical wiring with a sealant and covers the sealant, as described in Japanese Patent Laid-Open No. 2008-120056. According to this technology, the thickness of the sealant, or in other words, the height of the sealant with respect to the printing element substrate, may be controlled by the film. As a result, sealing may be conducting without regard for variation in thickness resulting from the process of applying the sealing, making it possible to form a sealant layer of uniform thickness on top of the electrical connection.

However, with the technology described in Japanese Patent Laid-Open No. 2008-120056, the position of the film may shift while in the process of curing after the sealant is filled and covered with the film, and in some cases the electrical connection may become exposed, for example. In response, to ensure coverage of the electrical connection even if the position of the film shifts, it is conceivable to increase the film to a sufficient size, but this configuration is not only uneconomical, but also carries the risk of an overly large film also covering the ejection openings of the printing element substrate.

SUMMARY OF THE INVENTION

An object of the present invention is to provide a liquid ejecting head manufacturing method that enables a film to be positioned with high precision to cover a sealant, as well as a liquid ejecting head manufactured with the method.

In a first aspect of the present invention, there is provided a method of manufacturing a liquid ejecting head for ejecting a liquid, the method comprising the steps of: preparing a member that includes a printing element substrate provided with ejection openings for ejecting liquid, a wiring board provided with an electrical wiring, and an electrical connection, provided between the printing element substrate and the wiring board, for electrically connecting the printing element substrate and the wiring board; supplying a sealant to a region between the printing element substrate and the wiring board that includes the electrical connection; holding a film with a holding member; and covering the electrical connection with the film after the holding step is executed.

According to the above configuration, it becomes possible to position a film with high precision to cover a sealant.

Further features of the present invention will become apparent from the following description of exemplary embodiments (with reference to the attached drawings).

BRIEF DESCRIPTION OF THE DRAWINGS

FIGS. 3A to 3C are diagrams illustrating a film covering method associated with the sealing of an electrical connection according to the first embodiment of the present invention;

FIGS. 6A to 6D are diagrams illustrating a film covering method associated with the sealing of an electrical connection according to the fourth embodiment of the present invention;

FIGS. 8A to 8D are diagrams illustrating a film covering method associated with the sealing of an electrical connection according to the seventh embodiment of the present invention;

DESCRIPTION OF THE EMBODIMENTS

Hereinafter, embodiments of the present invention will be described in detail and with reference to the drawings.

Figure 1:
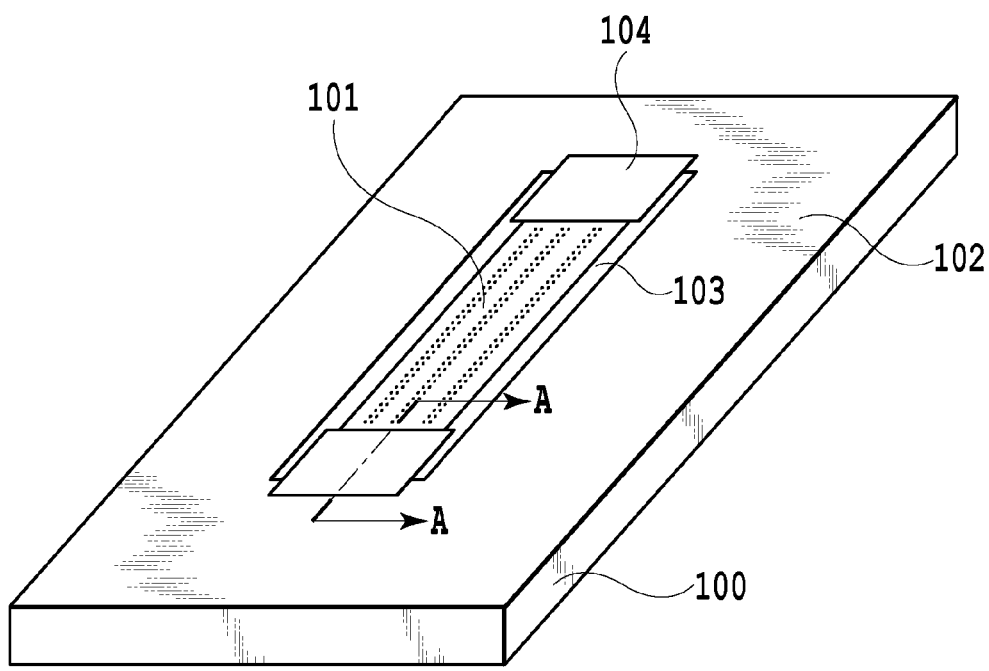
FIG. 1 is a perspective view schematically illustrating a printing element substrate that constitutes a liquid ejecting head according to an embodiment of the present invention.

FIG. 1 is a perspective view schematically illustrating a liquid ejecting head according to an embodiment of the present invention, and shows a print head used in an inkjet printing apparatus that performs printing by ejecting ink as liquid. Note that in the drawings referenced in the following description of the embodiments, including FIG. 1, similar elements are denoted with the same reference signs, and detailed description thereof is reduced or omitted.

As illustrated in FIG. 1, the liquid ejecting head of the present embodiment is configured by bonding, on top of a support member 100 provided with ink supply paths (not illustrated), a printing element substrate 101 on which ejection openings for ejecting ink are arranged, and a wiring board 102 for supplying electrical signals and the like to the printing element substrate. Via the wiring board 102, the printing element substrate 101 and the main body of the printing apparatus are electrically connected.

For the electrical connection between the printing element substrate 101 and the wiring board, a connection method using wire bonding and a lead frame is typical. In making an electrical connection between the wiring board 102 and the printing element substrate 101 with wire bonding and a lead frame or the like, the electrical connection is exposed, and thus the electrical connection is insulated by a sealant. Specifically, the space between the wiring board 102 and the printing element substrate 101 is filled with a liquid sealing resin 103. The sealing resin 103 fills the space between the wiring board 102 and the printing element substrate 101 with no gaps, and the use of a curable liquid sealing resin 103 is preferable. In addition, since the liquid sealing resin 103 preferably also fills in the space below the electrical connection between the printing element substrate 101 and the wiring board 102, the curable liquid sealing resin 103 preferably exhibits good insulating properties. Specific examples of the curable liquid sealing resin 103 include epoxy resin, acrylic resin, epoxy acrylate resin, imide resin, amide resin, and the like. Also, the curing method may be any of a wide variety of methods, such as curing by mixing with a curing agent, thermosetting, and UV curing using ultraviolet light. Among these, thermosetting epoxy resin is one example of a preferable liquid resin.

The upper part of the electrical connection between the wiring board 102 and the printing element substrate 101 is covered with a film 104, as discussed later with reference to FIGS. 3A to 3C and subsequent drawings. The film 104 protects and insulates the upper part of the electrical connection with covering a whole extent of the electrical connection and a portion of the film 104 being joined to the wiring board 102. In the present embodiment, after filling the gap between the wiring board 102 and the printing element substrate 101 with the liquid sealing resin 103, part of the film 104 is joined to part of the wiring board 102 that is not the electrical connection, and the other part of the film 104 covers the upper part of the electrical connection. Then, the liquid sealing resin 103 filling the space below the electrical connection rises up to the undersurface of the film 104 from below the electrical connection due to capillary action, and the sealing resin 103 may be cured directly in this state. A film of any material may be used as the film 104, insofar as the film has insulation protection properties and is resistant to printing liquid. Specific examples include thermoplastic resins such as polypropylene, polyethylene, polyethylene terephthalate, polybutylene terephthalate, polyphenylene sulfide, polyether ether ketone, fluoropolymers, polysulfone, polyethersulfone, polyarylate, polyamide, and polyimide, and thermosetting resins such as epoxy, acrylic, epoxy acrylate, epoxy amide, epoxy imide, amide acrylate, and imide acrylate. Also, glass fiber or the like may be used as inorganic material. In addition, a laminate of several of the above materials or a laminate of any of the above materials and a bonding layer or adhesive layer may also be used.

In the case of using a thermoplastic resin or thermosetting resin for the film 104, when joining the film. 104 to the wiring board 102, bonding by thermo-compression is preferable. In the thermo-compression bonding, using a thermoplastic resin or thermosetting resin as the film. 104 that exhibits adhesive or bonding properties due to the application of heat enables easy bonding to the wiring board 102. In the case of using for the film 104 a thermoplastic resin or thermosetting resin for which adhesion or bonding by thermo-compression is difficult due to restrictions on the temperature of applied heat, there is a method of dispersively combining a component that exhibits adhesion or bonding at low temperature into the resin component. Alternatively, a laminate of a thermoplastic resin or thermosetting resin with a separate adhesive layer or bonding layer that exhibits adhesive or bonding properties at low temperature may be used. In addition, the use of a commercially available tape in which an adhesive layer is laminated onto insulating matter as the film 104 is not problematic. In the case of a film 104 in which an adhesive layer having adhesive properties at room temperature is laminated onto the above materials, such as a generally available tape, bonding to the wiring board 102 may be conducted with the adhesive force alone, and the application of heat during application is not necessary. Since glass fiber, an inorganic material, does not have bonding or adhesive properties, when using glass fiber as the film 104, an bonding layer or adhesive layer may be laminated onto the glass fiber and used similarly to the above.

Figure 2:
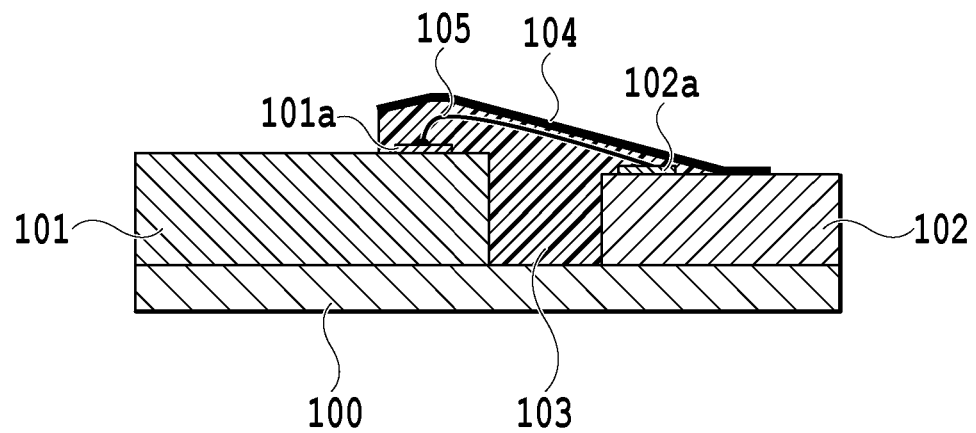
FIG. 2 is a cross-section taken along the line A-A in FIG. 1.

FIG. 2 is a cross-section taken along the line A-A in FIG. 1. As illustrated in FIG. 2, the wiring board 102 and the printing element substrate 101 are joined on the support member 100, and the wiring board 102 and the printing element substrate 101 are electrically connected by a wire 105. The film 104 covers the upper part of the wire 105 for insulating and protecting the upper part of the wire 105 that forms the electrical connection. In addition, the liquid sealing resin 103 filling the space between the wiring board 102 and the printing element substrate 101 moves into the space between the undersurface of the film 104 and the wire 105 due to capillary action, and thus the lower part of the wire 105 is insulated by the liquid sealing resin 103. In this way, the upper part of the wire 105 is insulated by the film 104, while the lower part is insulated by the sealing resin 103.

Hereinafter, several embodiments of methods for sealing and covering an electrical connection using the film 104 between the printing element substrate 101 and the wiring board 102 in a liquid ejecting head of the embodiment described above will be described.

(First Embodiment)

FIGS. 3A to 3C are diagrams illustrating a film covering method associated with the sealing an electrical connection according to the first embodiment of the present invention.

FIG. 3A illustrates a state in which the space below the wire 105 of the electrical connection between the printing element substrate 101 and the wiring board 102 on the support member 100 is filled with a liquid sealing resin (sealant) 103. When joining the printing element substrate 101 and the wiring board 102 to the support member 100, a bonding agent, double-sided tape, or the like is used. In the present embodiment, an epoxy-based bonding agent is used for joining. The printing element substrate 101 and the wiring board 102 are electrically connected by wire bonding, in which the wire 105 is connected to pads 101a and 102a on both.

After the component members of the ejecting head are prepared, a process of applying (supplying) the sealing resin 103 between the printing element substrate 101 and the wiring board 102 is executed. Thereby, the sealing resin 103 climbs up to the underside of the wire 105 of the printing element substrate 101 due to capillary action, as shown in FIG. 3A. As a result, the space below the wire 105 is completely filled with the sealing resin 103. Note that in the present embodiment, a thermosetting epoxy-based resin compound is used as the sealing resin 103.

Next, as shown in FIG. 3B, the film 104 is held by a suction finger (holding member) 106 while the suction finger 106 is moved so that the film 104 is positioned above the electrical connection in which the wire 105 is connected. Note that in the present embodiment, the resin film DF-470 containing a thermosetting component and sold by Hitachi Chemical is used as the film 104. The film DF-470 exhibits adhesive properties in response to the application of heat, enabling provisional fixing to the adherend, and additionally has a property of bonding to the adherend with continued application of heat.

As shown in FIG. 3B, in the present embodiment, positioning is conducted in a state in which part of the film 104 is held to the finger 106 by suction. Specifically, the part of the film 104 held to the finger 106 by suction is positioned at a site on the wiring board 102 excluding the wire 105 and the bonding portion 102a of the wire 105. By attaching the film at this position, it is possible to prevent deformation due to the pressure of attachment being exerted on the wire 105 or the bonding portion 102a.

Next, as shown in FIG. 3C, the finger 106 positioned in the state described above is moved downward, and the part of the film 104 is pressed and fixed to the wiring board 102. At this point, since the finger 106 is in a heated state at 110° C., the film 104, which exhibits adhesive properties due to the application of heat, is bonded to the wiring board 102 by thermo-compression. Note that at this point, when the film. 104 is bonded to the wiring board 102 by thermo-compression with the finger 106 in a heated state, it is anticipated that the film 104 will adhesively bond to both the wiring board 102 and the finger 106. However, by applying a coating such as a fluoropolymer to the surface of the finger 106 that suctions the film 104, the film 104 may be bonded to the wiring board 102 by thermo-compression without adhering to the finger 106.

After part of the film 104 is thermo-compressed at the position indicated in FIG. 3C, the electrical connection including the wire 105 is covered by the other part of the film 104. In this case, the film 104 was made touch the part of the wire 105, and then joined to the wiring board 102 by thermo-compression. Then, after covering the electrical connection including the wire 105 with the film 104 in this way, a gap is often formed between the wire 105 and the film 104, as shown in FIG. 3C. However, if the film 104 contacts the sealing resin 103 even slightly, capillary action of the liquid sealing resin 103 is produced due to the space formed between the wire 105 and the film 104, resulting in a state in which the space above and below the wire 105 is filled with sealing resin without any gaps, as illustrated in FIG. 2. Subsequently, by heating and curing the sealing resin 103 in the state illustrated in FIG. 2, the wire 105 and the bonding portions 101a and 102a are insulated by the film 104 and the sealing resin 103.

Note that the capillary action of the sealing resin 103 occurs after the film 104 is applied, and continues until the space between the wire 105 and the film 104 is filled. Also, when curing the sealing resin 103 with heat, the above capillary action becomes active because of the reduced viscosity of the sealing resin 103 at the beginning of the heating process.

By fixing a part of the film 104 to the wiring board 102 as above, it is possible to prevent later shifting of the position of the film as the sealing resin 103 flows while being covered by the film 104. As a result, it becomes possible to conduct covering with the film 104 in a precisely positioned state.

(Second Embodiment)

FIGS. 4A to 4D are diagrams illustrating a film covering method associated with the sealing an electrical connection according to the second embodiment of the present invention. The present embodiment relates to sealing with a sealant and the corresponding covering with a film for a configuration in which the printing element substrate 101 and the wiring board 102 are electrically connected by an inner lead 107.

Figure 4A:
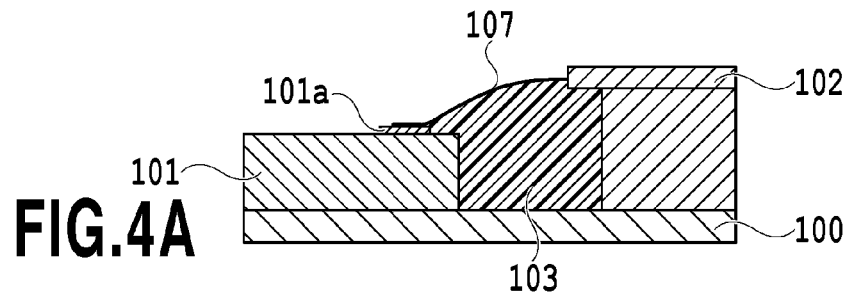
FIGS. 4A to 4D are diagrams illustrating a film covering method associated with the sealing of an electrical connection according to the second embodiment of the present invention.

As shown in FIG. 4A, the printing element substrate 101 and the wiring board 102 are electrically connected through an inner lead 107 projecting from the wiring board 102. In the sealing process, first, the space between the printing element substrate 101 and the wiring board 102 is filled with the liquid sealing resin 103. In addition, the space below the inner lead 107 is also filled with the liquid sealing resin 103 due to capillary action. Note that a thermosetting epoxy resin compound similar to the first embodiment is used for the liquid sealing resin 103.

Figure 4B:
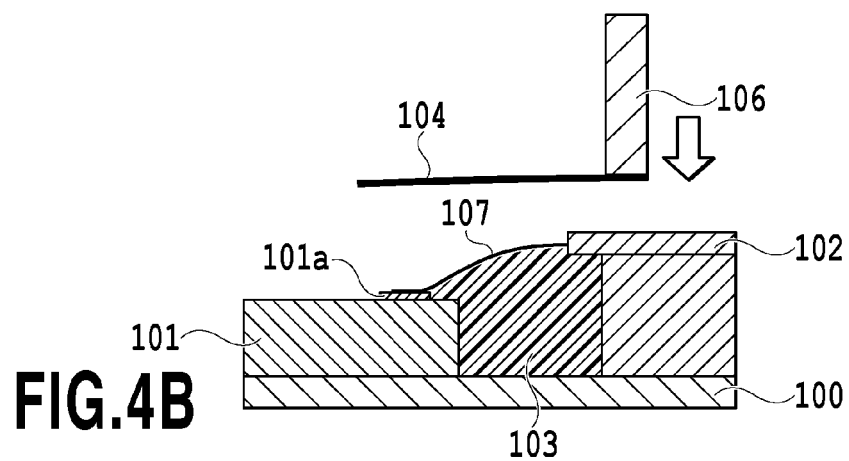

Next, as shown in FIG. 4B, the film 104 is applied for covering the upper part of the inner lead 107. In the present embodiment, a dual-layer film 104 made by thermo-compressing DF-470 sold by Hitachi Chemical and Upilex sold by Ube Industries is used. The Upilex surface of this dual-layer film 104 is held by suction to the finger 106 heated to 100° C., while the finger 106 is moved downward and the film 104 is positioned on the wiring board 102.

Figure 4C:
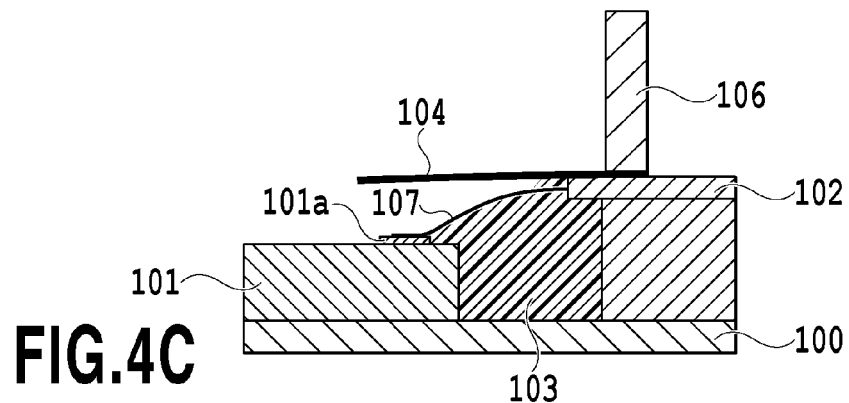

Next, as shown in FIG. 4C, the surface on the DF-470 side of the film 104 is pressed against a part of the wiring board 102. Since the finger 106 is heated to 100° C., as discussed earlier, the DF-470 constituting the film 104 exhibits adhesive properties and is fixed to the wiring board 102. On the other hand, since the surface of the film 104 contacting the finger 106 is Uniplex, which is highly heat resistant, the film 104 does not adhere to the suction face of the finger 106.

Figure 4D:
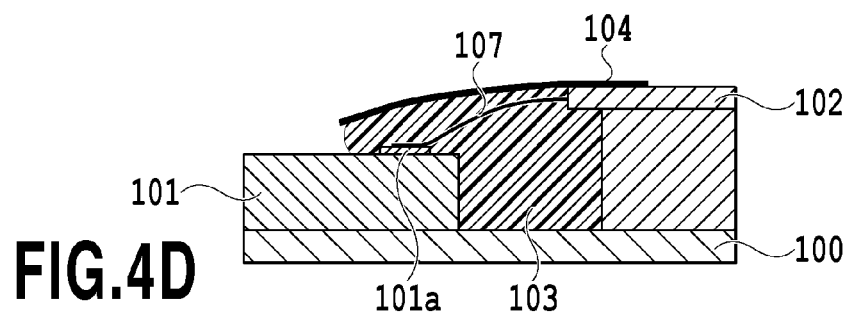

After covering the space above the electrical connection including the inner lead 107 with the film 104 as above, a gap is often produced between the inner lead 107 and the film 104, as shown in FIG. 4C. However, if the film 104 contacts the sealing resin 103 even slightly, capillary action of the liquid sealing resin 103 is produced due to the space formed between the inner lead 107 and the film 104. Subsequently, as shown in FIG. 4D, the liquid sealing resin 103 climbs up between the film 104 and the inner lead 107 by capillary action, and the upper part of the inner lead 107 is insulated and protected by the sealing resin 103 and the film 104.

In the above process, the position of the film 104 is fixed by thermo-compression when applying the film 104 to the wiring board 102, thereby preventing later shifting of the position of the film as the sealing resin 103 flows while being covered by the film 104. As a result, it becomes possible to conduct covering with the film 104 in a precisely positioned state.

(Third Embodiment)

FIGS. 5A to 5E are diagrams illustrating a film covering method associated with the sealing an electrical connection according to the third embodiment of the present invention. The present embodiment relates to a configuration using a support member 108 that internally includes electrical wirings.

Figure 5A:
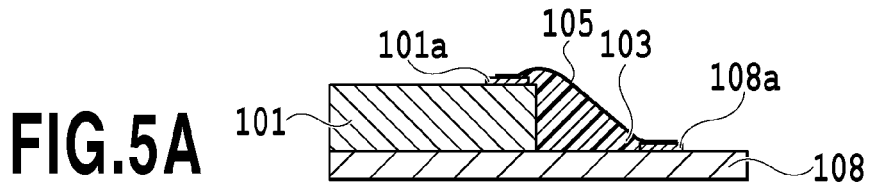
FIGS. 5A to 5E are diagrams illustrating a film covering method associated with the sealing of an electrical connection according to the third embodiment of the present invention.

FIG. 5A illustrates a part of a liquid ejecting head configured by joining the printing element substrate 101 by a bonding agent on a support member 108 which is internally provided with electrical wirings (not illustrated). A connection pad 108a provided on the support member 108 that internally includes electrical wirings is connected to the pad 101a of the printing element substrate 101 through the wire 105. The liquid sealing resin 103 does not flow over onto the upper side of the wire 105 due to surface tension, and instead forms a meniscus in the gap between the wire 105 and the support member or chip below, and maintains the state shown in FIG. 5A. Note that a thermosetting epoxy resin compound similar to the first embodiment is used for the liquid sealing resin 103.

Figure 5B:
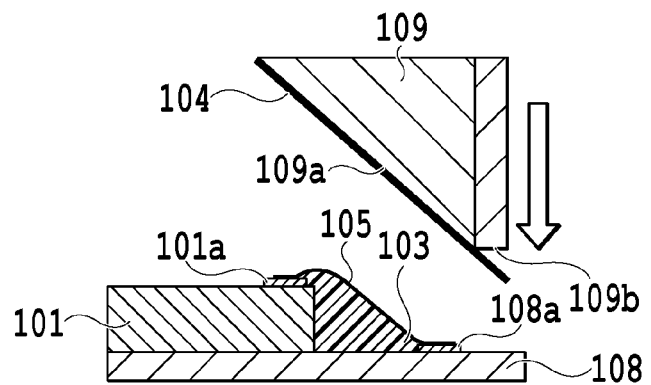

From the state shown in FIG. 5A, the film 104 is applied next, as illustrated in FIG. 5B. In the present embodiment, Meta-seal sold by Fujimori Kogyo is used as the film 104. Other materials that may be used as the film 104 include, for example, a film obtained by coextruding Modic PP grade by Mitsubishi Chemical, in which polar groups are incorporated into polypropylene. The thermoplastic film 104 is a hot melt adhesive film that may be made to soften, exhibit adhesive properties, and bond to an adherend by applying heat, but does not soften or melt under normal temperatures. In the present embodiment, as illustrated in FIG. 5B, a finger 109 that suctions the film 104 onto a sloped face with respect to the support member 108 is used. The finger 109 has the above sloped face 109a and a face 109b that is substantially parallel with the surface of the support member 108. The flat face 109b is not equipped with a suction function. In this way, the finger 109 holds the film 104 with the sloped face 109a, moves downward, and positions the film 104 over the support member 108.

Figure 5C:
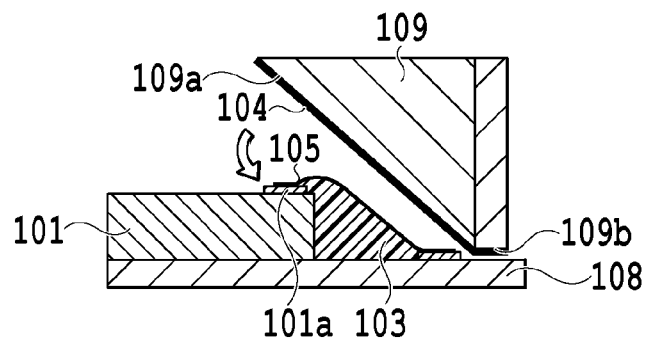

Next, as illustrated in FIG. 5C, the film 104 is joined to the support member 108 by thermo-compression at the determined position. In the present embodiment, thermo-compression of the film 104 is conducted by heating the support member 108 rather than heating the finger 109. By heating the support member 108 to 100° C. in advance, the film 104 is joined by thermo-compression. Consequently, the film 104 exhibits adhesive properties and is fixed to the support member 108, as discussed earlier.

Figure 5D:
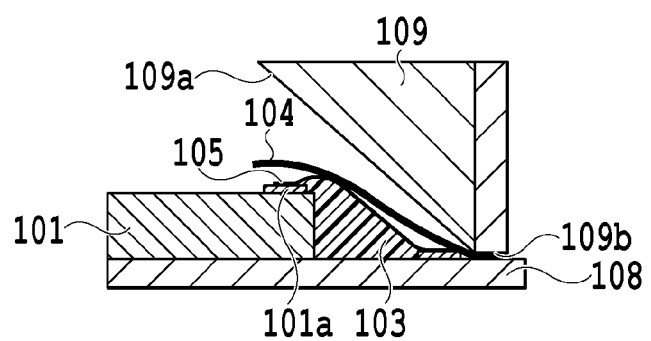

After the thermo-compression, the suction by the sloped face 109a of the finger 109 is stopped, and the holding of the film 104 by the sloped face 109a is released. Consequently, as illustrated in FIG. 5D, the film 104 (excepting the part fixed to the support member 108) moves downward due to gravity, and is able to cover the upper part of the wire 105.

By conducting covering by suctioning the film 104 with the sloped face 109a of the finger 109 in this way, the film 104 is able to provide a cover to the wire 105 along the shape in which the wire 105 extends, or in other words, in close proximity to the overall of the wire 105. As a result, the amount of air entered between the film 104 and the wire 105 may be decreased, and the quantity of air bubbles produced underneath the film 104 during the later process of curing the sealing resin 103 may be reduced. Note that although the film 104 is thermo-compressed by heating the support member 108 in the present embodiment, thermo-compression may also be conducted by heating the finger 109 suctioning the film 104 without heating the support member 108, similarly to the first and second embodiments discussed earlier. In this case, the flat face 109b of the finger 109 suctioning the film 104 is heated, and a coating such as a fluoropolymer is additionally applied to the surface of the finger 109 so that the film 104 does not stick. Alternatively, the film may be formed on a material with a higher melting temperature than polyolefin, such as PET film, for example, and pressed through the PET film. The PET film may then be peeled off later.

Figure 5E:
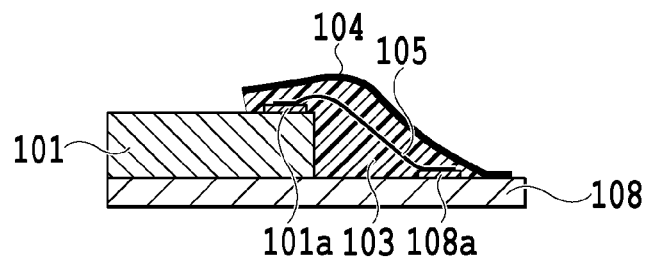

After pressing the film 104 to the support member 108, as illustrated in FIG. 5E, the sealing resin 103 filling the space below the wire 105 climbs up between the film 104 and the wire 105 by capillary action, and the wire 105 and electrical connection become insulated and protected by the sealing resin 103 and the film 104. After that, the sealing resin 103 is heated and cured.

During the above process of the sealing resin 103 flowing into the space below the film 104, part of the film 104 may be fixed to the support member 108 in advance. Consequently, it is possible to prevent shifting of the position of the film as the sealing resin 103 flows while being covered by the film 104, and it becomes possible to conduct covering with the film 104 in a precisely positioned state.

Note that although the above description gives Meta-seal sold by Fujimori Kogyo and Modic by Mitsubishi Chemical as examples of the material of the film 104, the material of the film 104 is not limited thereto, and may be a polyolefin or any material that at least includes a modified polyolefin. Preferably, the modified polyolefin is acid-modified polypropylene. With an acid modification, a liquid ejecting head that bonds well with encapsulating epoxy resin in particular and has excellent reliability may be obtained. From the perspective of bonding and chemical resistance, the polyolefin may be polyethylene or polypropylene, and modifications of these are suitable for use. In order to improve adhesion of the polyolefin, various additives may also be used. Specific examples of polyolefin are given below.

For example, the polyolefin may be: low-density polyethylene (LDPE); various types of linear high-density polyethylene (HDPE) made by a gas phase method, a solution method, a liquid phase slurry method, or the like by using a Ziegler catalyst, a Phillips catalyst, or a metallocene catalyst; polypropylene or medium-density polyethylene (MDPE); linear low-density polyethylene (LLDPE) or very/ultra low-density polyethylene (VLDPE, ULDPE); or an ethylene/α-olefin copolymer such as an ethylene-propylene random copolymer or block copolymer, or a low crystallinity ethylene-butene-1 random copolymer (EBM).

In addition, the α-olefin of the ethylene/α-olefin copolymer may be 1-butene, 1-hexene, 4-methyl-1-pentene, 1-octene, or 1-decene, for example.

Specific examples of denaturants for modifying the polyolefin are given below. Namely, the denaturant may be unsaturated carboxylic acid, unsaturated carboxylic acid anhydride, or a derivative thereof (such as (meth)acrylic acid, maleic acid, fumaric acid, itaconic acid, citraconic acid, or a derivative such as an hydride, amide, imide, or ester of the above); a hydroxyl group-containing polymerizable unsaturated compound such as hydroxyalkyl(meth)acrylate; an epoxy group-containing polymerizable unsaturated compound such as 1-vinyl-3,4-epoxycyclohexene or 3,4-epoxycyclohexylmethyl(meth)acrylate; an isocyanate group-containing polymerizable unsaturated compound such as isocyanate-modified (meth)acrylate; or a silane-containing polymerizable unsaturated compound such as vinyltrimethoxysilane or vinyltriethoxysilane.

The above denaturants may be copolymerized during the polyolefin fabrication, or graft polymerized to the polyolefin.

The additive may be an adhesive, a silane coupling agent, or another polymer, for example. The adhesive may be petroleum resin, a rosin-based resin, a triterpene-based resin, or hydrogenations of the above, for example. The silane coupling agent may be vinylsilane, acrylsilane, epoxysilane, mercaptosilane, aminosilane, methylsilane, chlorosilane, or phenylsilane, for example. Also, commercial products that may be suitably used as the modified polyolefin include Himilan by Du Pont-Mitsui Polychemicals, in which a metal compound is incorporated into a copolymer such as a polyolefin and unsaturated carboxylic acid to form a polymer typically referred to as an ionomer, and Modic by Mitsubishi, in which polar groups are incorporated into a nonpolar polyolefin.

(Fourth Embodiment)

FIGS. 6A to 6D are diagrams illustrating a film covering method associated with the sealing an electrical connection according to the fourth embodiment of the present invention. The present embodiment relates to a configuration in which the space between the printing element substrate 101 and the wiring board is filled with a comparatively large quantity of liquid sealing resin 103.

As illustrated in FIG. 6A, in the liquid ejecting head of the present embodiment, the wiring board has a dual-layer structure made up of a first layer 110 provided with a pad 110a for electrically connecting with the printing element substrate 101, and a second layer 111 stacked on the first layer 110. Note that electrical connections may or may not be provided in the second layer 111 of the wiring board, and in addition, the number of layers of the wiring board is not limited to one layer.

In the process illustrated in FIG. 6A, the printing element substrate 101 and the first layer 110 of the wiring board are electrically connected by the wire 105. From this state, the space between the printing element substrate 101 and the wiring board is filled with liquid sealing resin 103. Since the sealing resin 103 is applied over a comparatively broad space, a large quantity of sealing resin 103 fills the space. In other words, the sealing resin 103 does not form a meniscus with the wire 105, and fills up to the end of the second layer 111 of the wiring board, which is a region that includes the upper side of the wire 105. Note that a thermosetting epoxy resin compound similar to the first embodiment is used for the liquid sealing resin 103.

Next, the film 104 is applied, as illustrated in FIG. 6B. In the present embodiment, a material similar to the second embodiment is used as the film 104. The film 104 is fixed to the finger 106 by suction, and the finger 106 is moved downward while positioning the film 104 over the second layer 111 of the wiring board. In this case, the finger 106 is in a heated state.

Next, as illustrated in FIG. 6C, the film 104 is thermo-compressed against the top of the second layer 111 of the wiring board. Since the film 104 has a property of exhibiting adhesive properties with the application of heat, by pressing with the heated finger 106, the film 104 is fixed to the top of the second layer 111 of the wiring board. Also, when part of the film 104 is fixed to the top of the second layer 111 of the wiring board, the other part of the film 104 covers the wire 105.

Next, after covering with the film 104 in this way, as illustrated in FIG. 6D, the sealing resin 103 fills the space between the film 104 and the wire 105 by capillary action, and the entire wire 105 and electrical connection become covered by the sealing resin 103 and the film 104. After that, the sealing resin 103 is heated and cured.

Likewise in the present embodiment, since a part of the film 104 is applied to the top of the wiring board by thermo-compression, it is possible to prevent shifting of the position of the film even as the sealing resin flows during this process. As a result, a liquid ejecting head with a precisely positioned film applied thereto may be obtained.

(Fifth Embodiment)

The present embodiment relates to a configuration in which a material that is adhesive at normal temperature, such as Kapton tape by Teraoka Seisakusho, for example, is used for the film 104 covering the electrical connection, and the adhesiveness of Kapton tape is utilized to apply the film to the wiring board. Otherwise, a liquid ejecting head with the same configuration as the first embodiment is created. In the present embodiment, a finger having a suction mechanism is made to suction the layer opposite the adhesive layer of the film 104, as illustrated in FIG. 3B according to the first embodiment, while the adhesive force of the film 104 is utilized to apply the film 104 to the wiring board 102, as illustrated in FIG. 3C.

In the present embodiment, the film 104 is applied to the wiring board by adhesive force, and as a result, similarly to foregoing embodiments, the film 104 may be applied with high positional precision, even if the sealing resin 103 flows.

(Sixth Embodiment)

Figure 7A:
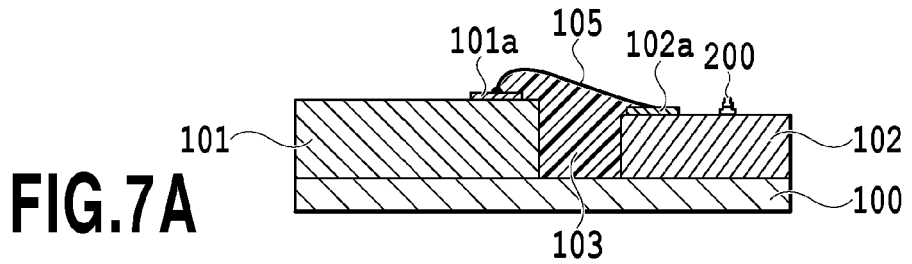
FIGS. 7A to 7D are diagrams illustrating a film covering method associated with the sealing of an electrical connection according to the sixth embodiment of the present invention.

FIGS. 7A to 7D are diagrams illustrating a film covering method associated with the sealing an electrical connection according to the sixth embodiment of the present invention. As illustrated in FIG. 7A, the present embodiment differs from the configuration according to the first embodiment illustrated in FIG. 3A in that a projection 200 is formed on the wiring board 102. The printing element substrate 101 and the wiring board 102 are electrically connected by wire bonding using the wire bonding device FB-880 by Kaijo Corporation. In other words, respective ends of the wire 105 are connected to the pads 101a and 102a. After wire bonding, the same wire bonding device is used to form the projection 200 for catching the film 104 with a stud bump on the wiring board 102. The stud bump formation conditions are a frequency of 100 kHz, a bond load of 50 g, and an initial ball diameter ø 60 µm, and the projection 200 is formed by piling the stud bump. The bump height is preferably configured to be thicker than the thickness of the film 104. Herein, the bump height is configured to 140 µm. Additionally, by supplying the curable liquid sealing resin 103 between the printing element substrate 101 and the wiring board 102, the sealing resin 103 fills up to the electrical connection of the wire 105 of the printing element substrate 101 by capillary force.

Figure 7B:
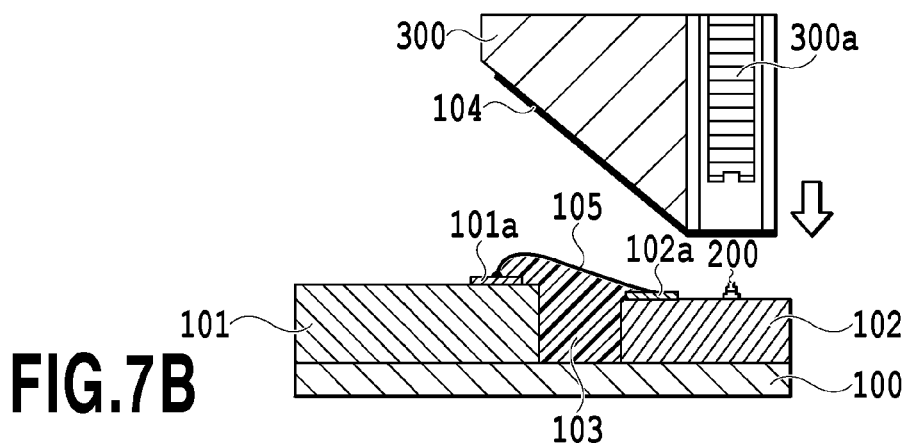

Next, as illustrated in FIG. 7B, a suction finger 300 is used to apply the film 104 to the wiring board 102. A swaging finger 300a is built into the finger 300 for swaging the projection 200. Subsequently, the part of the film 104 held to the finger 300 by suction is positioned at a site on the wiring board 102 excluding the wire 105 and the bonding portion of the wire 105, and the film 104 is applied. In this case, the film 104 engages with the projection 200, and after that, the projection 200 is swaged. Note that during the positioning, it is also possible to use the tip of the projection as an alignment mark.

Figure 7C:
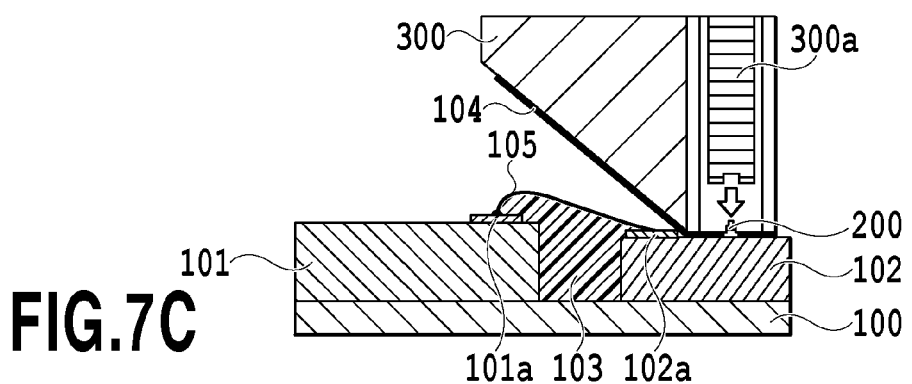
Figure 7D:
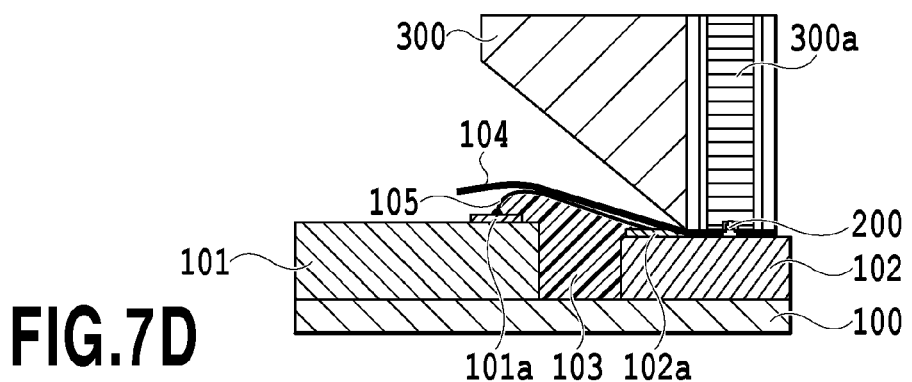

Next, as illustrated in FIG. 7C, part of the film 104 is pressed against the wiring board 102. During this compression, as illustrated in FIG. 7D, the swaging finger 300a swages the projection 200 and temporally joints the film 104. Since the film 104 is fixed while being temporally jointed on the projection 200, precise application becomes possible, even for a film that deforms easily under heat.

The finger 300, after temporally jointing the film 104 on the projection 200, thermo-compresses the film 104 at the position illustrated in FIG. 7C while blowing in the opposite direction of the suction used to hold the film 104 to the finger 300, and as illustrated in FIG. 7D, separates the film 104 from the finger 300 while also bringing the film 104 in contact with the wire 105.

In this way, in the present embodiment, the film. 104 likewise may be applied with precise positioning, even if the sealing resin 103 flows.

(Seventh Embodiment)

FIGS. 8A to 8D are diagrams illustrating a film covering method associated with the sealing an electrical connection according to the seventh embodiment of the present invention. The configuration of the liquid ejecting head of the present embodiment is mostly similar to the sixth embodiment discussed earlier, and differs in that an opening 301 in the film 104a is formed in advance using a laser processing tool. The resin film DF-470 is used as the film.

As illustrated in FIG. 8B, a suction finger 300 is used to apply the film 104a to the wiring board 102. In this case, the film 104a is positioned so that the central axis of the opening 301 is aligned with the central axis of the projection 200.

Next, as illustrated in FIGS. 8C and 8D, part of the film 104a is pressed against the wiring board 102. The configuration that compresses and swages the projection 200 is similar to the sixth embodiment discussed earlier, and thus further description will be reduced or omitted. The film 104a is positioned so that the central axis of the opening 301 is aligned with the central axis of the projection 200, and then compressed while being temporally joined on the projection 200. Consequently, the film 104a may be applied with precise positioning.

(Eighth Embodiment)

Figure 9A:
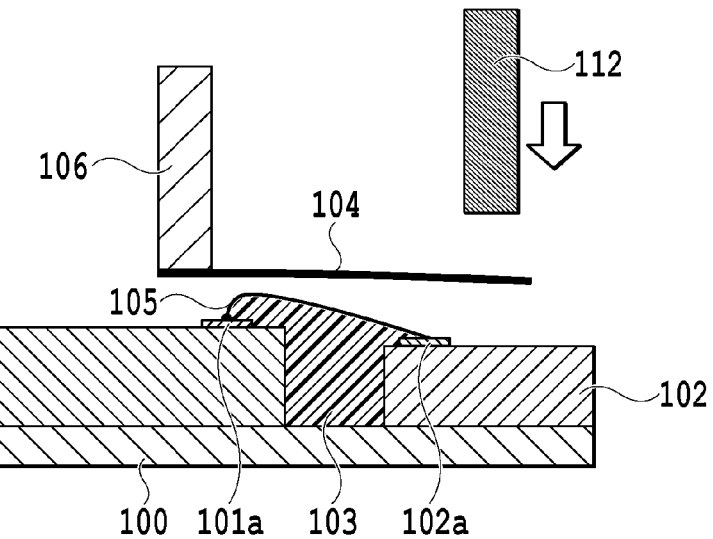
FIGS. 9A to 9C are diagrams illustrating a film covering method associated with the sealing of an electrical connection according to the eighth embodiment of the present invention.
Figure 9B:
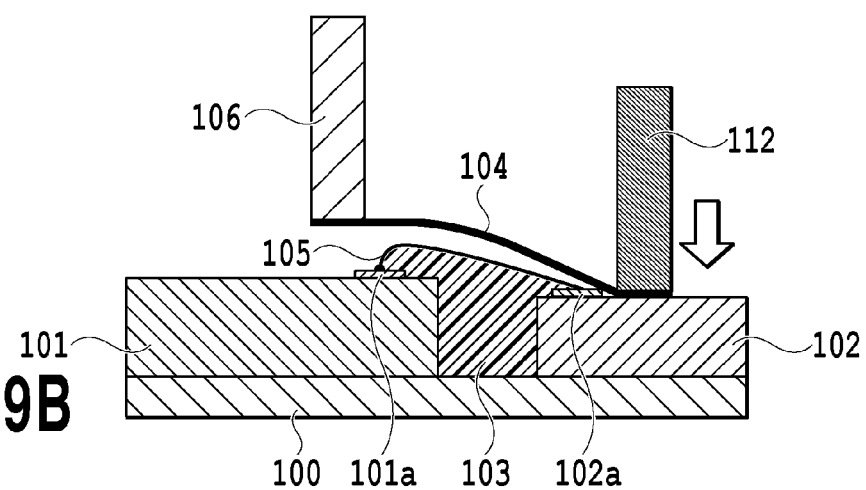
Figure 9C:
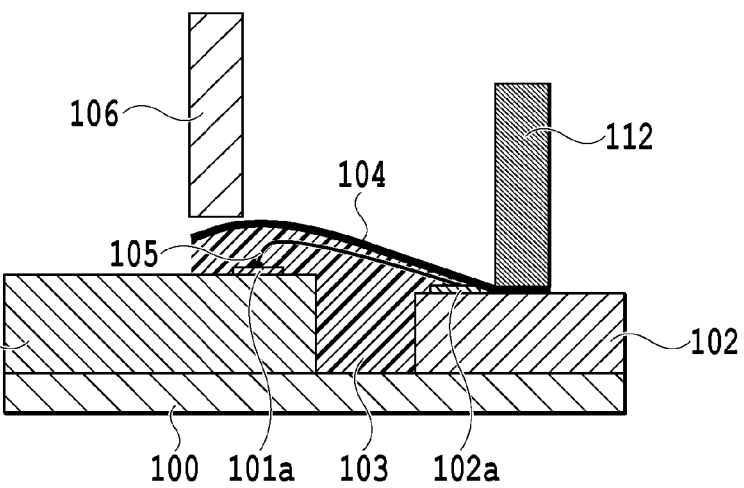

FIGS. 9A to 9C are diagrams illustrating a film covering method associated with the sealing an electrical connection according to the eighth embodiment of the present invention. The present embodiment relates to a configuration in which the finger that presses the film and the finger that holds the film by suction are separate. Thereby, the intrusion of air bubbles underneath the film is inhibited.

As illustrated in FIG. 9A, the printing element substrate 101 and the wiring board 102 joined on t the support member 100 are connected by the wire 105. Subsequently, the space below the wire 105 is filled with the liquid sealing resin 103. With the liquid ejecting head in this state, the film 104 is held to the suction finger 106 by suction and stands by above the wire 105. Meanwhile, to the right of the suction finger 106, a finger 112 for pressing the film 104 stands by. Note that a film similar to the fourth embodiment is used as the film 104 of the present embodiment.

From the state illustrated in FIG. 9A, next, as illustrated in FIG. 9B, the finger 112 is lowered while determining position with respect to the wiring board, and thermo-compresses to the wiring board 102 the end of the film 104 that is opposite the end being held to the suction finger 106 by suction. In this case, the pressing finger 112 is heated to 200° C., and the film 104 is thermo-compressed onto the wiring board by the heat of the finger 112.

Next, as illustrated in FIG. 9C, when the finger 106 is lowered enough for the film 104 to be in overall contact with the part of the wire 105 from the electrical connection with the wiring board 102 to the curved part of the wire on the side of the printing element substrate 101, the suction by the suction finger 106 is stopped, and the film 104 is released from the finger 106. As a result, the film 104 moves downward due to gravity, and covers the wire 105. Subsequently, after being covered by the film 104, the liquid sealing resin 103 fills in the space below the film 104 from the wiring board side by capillary force. After that, heat treatment is applied to cure the liquid sealing resin 103. During this process, since the film 104 is separated from the finger after the film 104 makes overall contact with the part of the wire 105 described above, air entered between the film 104 and the wire 105 may be reduced, and as a result, air caught between the film 104 and the wire 105 may be reduced when curing the sealing resin. In addition, in the present embodiment, it is likewise possible to attach the film at a precise position, similarly to the foregoing embodiments. Note that although the above embodiment describes an example in which the film 104 and the wire 105 make contact after the finger 112 is lowered and thermo-compresses the film 104 to the wiring board 102, the application of the present invention is not limited thereto, and the film 104 may also be thermo-compressed to the wiring board after the film 104 and the wire 105 make contact.

(Ninth Embodiment)

Figure 10:
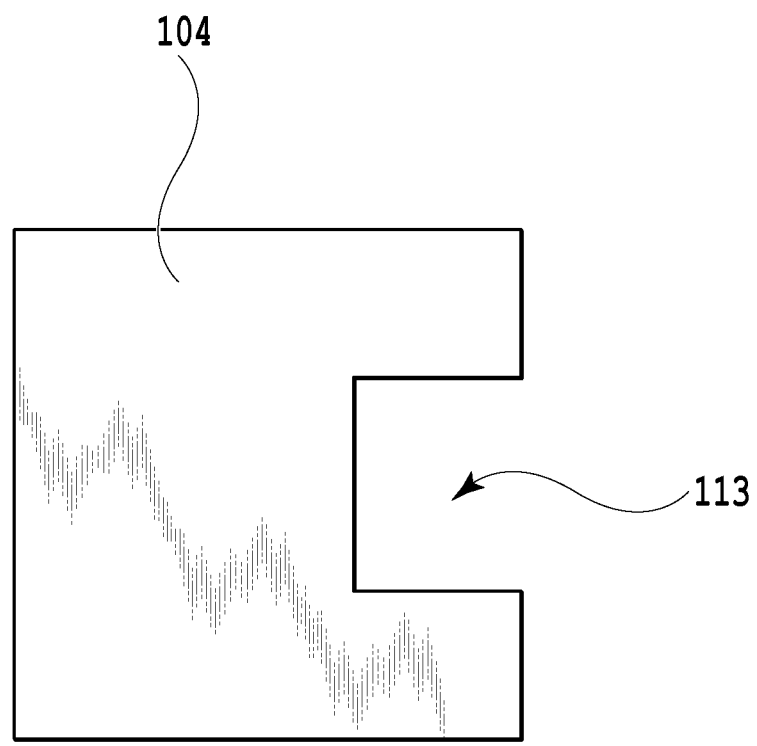
FIG. 10 is a plan view illustrating a film used in the sealing of an electrical connection according to the ninth embodiment of the present invention.

FIG. 10 is a plan view illustrating a film used in the sealing an electrical connection according to the ninth embodiment of the present invention. The present embodiment relates to a configuration that inhibits the mixing of air bubbles into the sealing resin underneath the film by configuring the film used for sealing into a specific shape.

As illustrated in FIG. 10, a cutout 113 is provided in the film 104 that corresponds to the part of the electrical connection. Note that the present embodiment uses a film, printing element substrate, and wiring board similar to the fourth embodiment. In addition, the film 104 having the cutout 113 is used to create a liquid ejecting head similarly to the fourth embodiment. In this case, the end (edge) of the film 104 on the side with the cutout 113 is thermo-compressed to the wiring board by a finger.

Figure 11:
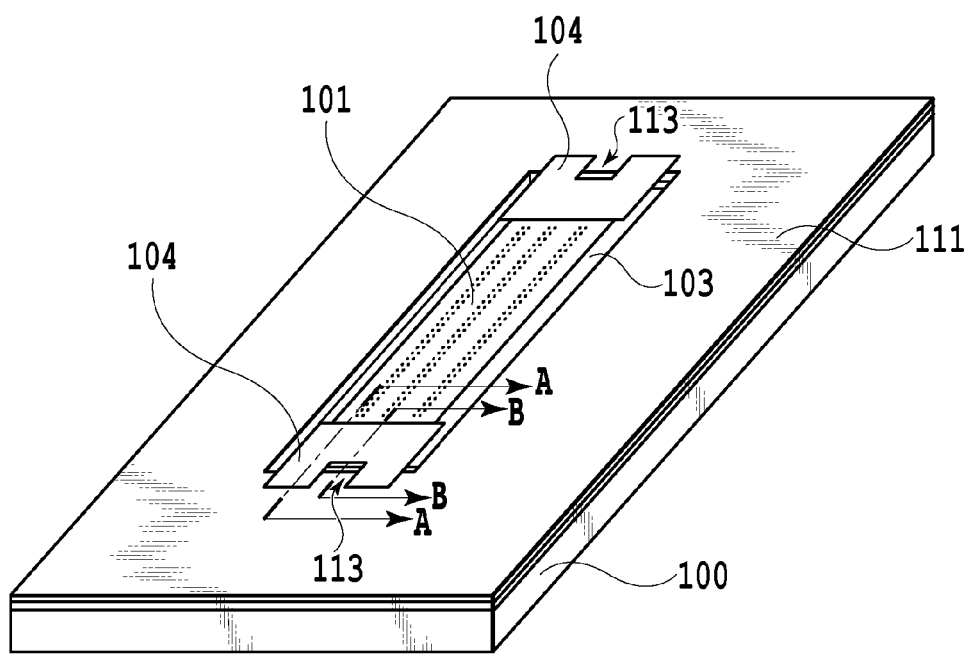
FIG. 11 is a perspective view illustrating a liquid ejecting head in a state in which a bonding wire is covered by a film having a U-shape, according to the ninth embodiment.
Figure 12A:
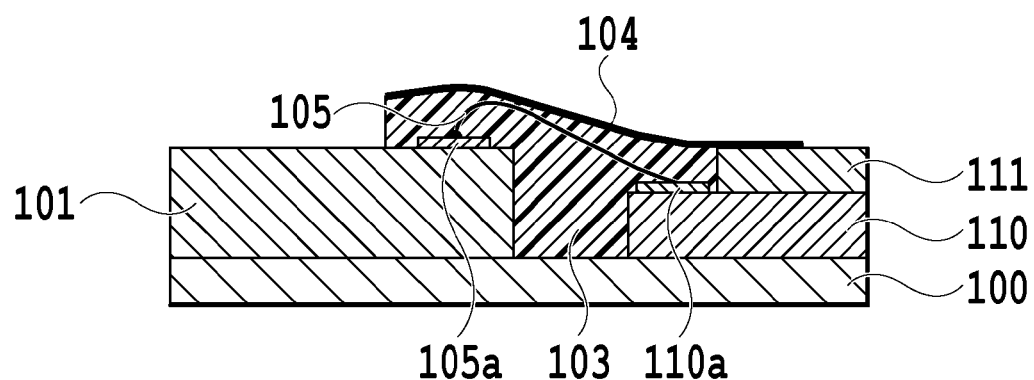
FIGS. 12A and 12B are diagrams illustrating cross-sections along the lines A-A and B-B in FIG. 11, respectively.
Figure 12B:
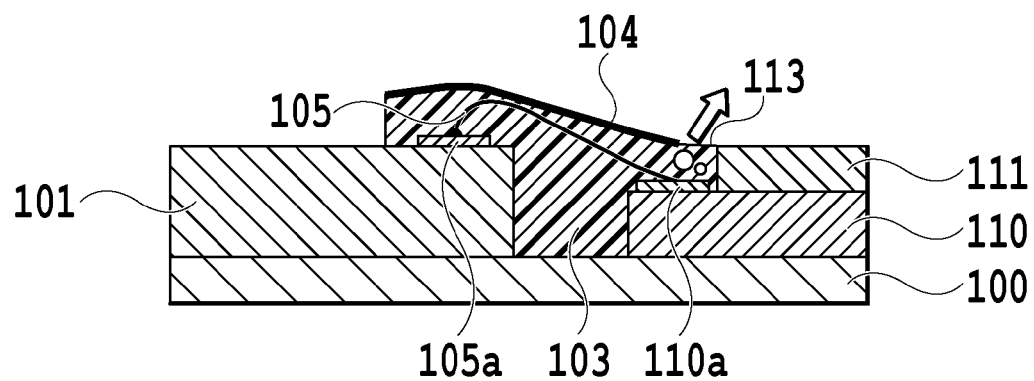

FIG. 11 is a perspective view illustrating a liquid ejecting head in a state in which the wire 105 is covered by the film 104 having the U-shape cutout. Also, FIGS. 12A and 12B are diagrams illustrating cross-sections along the lines A-A and B-B in FIG. 11, respectively. As illustrated in FIG. 12A, in the part of the film 104 where the cutout 113 does not exist, the sealing resin 103 fills the enclosed space covered by the film 104 overhead between the wire 105 and the wiring board 111. Meanwhile, as illustrated in FIG. 12B, in the part where the cutout 113 exists, an opening is formed by the cutout above the part adjacent to the second layer of the wiring board 111. Because of the existence of this opening, air bubbles caught as the any part of the sealing resin flows and cures, including the sealing resin 103 that exists in the enclosed space described above, are discharged through the opening. As a result, it is possible to inhibit the mixing of air bubbles into the sealing resin underneath the film 104. Additionally, it is also possible to obtain a liquid ejecting head with a precisely positioned film 104 applied thereto, similarly to the foregoing embodiments.

(Tenth Embodiment)

Figure 13A:
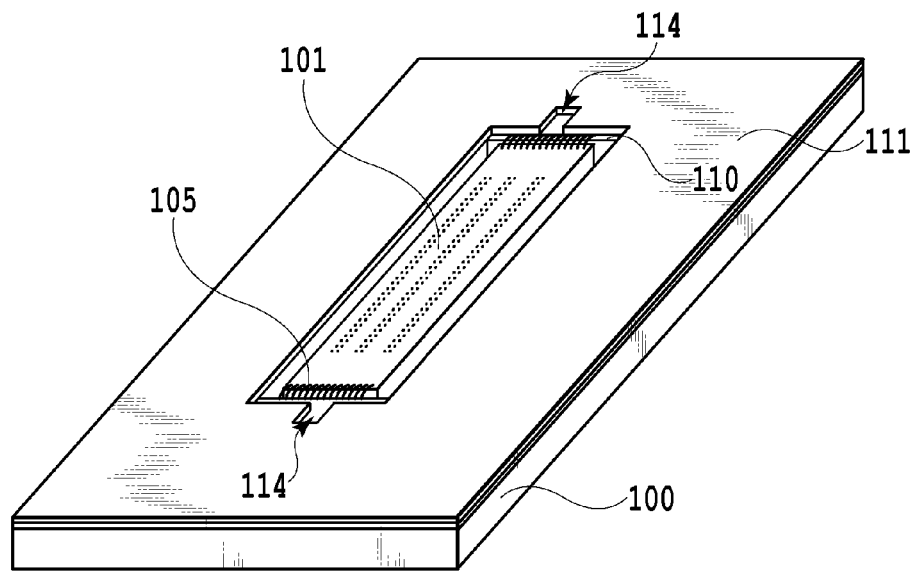
FIGS. 13A and 13B are perspective views illustrating a configuration of a wiring board in particular of a liquid ejecting head according to the tenth embodiment of the present invention.
Figure 13B:
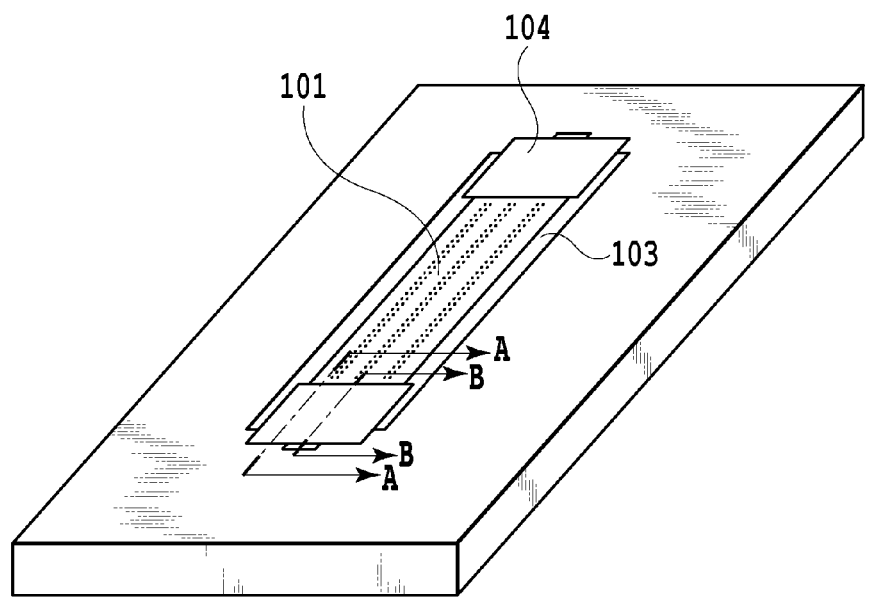

FIGS. 13A and 13B are perspective views illustrating a configuration of a wiring board in particular of a liquid ejecting head according to the tenth embodiment of the present invention. The present embodiment relates to a configuration that inhibits the mixing of air bubbles into the sealing resin underneath the film by configuring the wiring board into a specific shape.

As illustrated in FIG. 13A, a recessed part 114 is formed in the part adjacent to the electrical connection by the wire 105 of the second layer 111 of the wiring board onto which the film is applied. Additionally, as illustrated in FIG. 13B, the film 104 is applied to the second layer 111 of the wiring board having this recessed part 114 so as to straddle the recessed part 114.

Figure 14A:
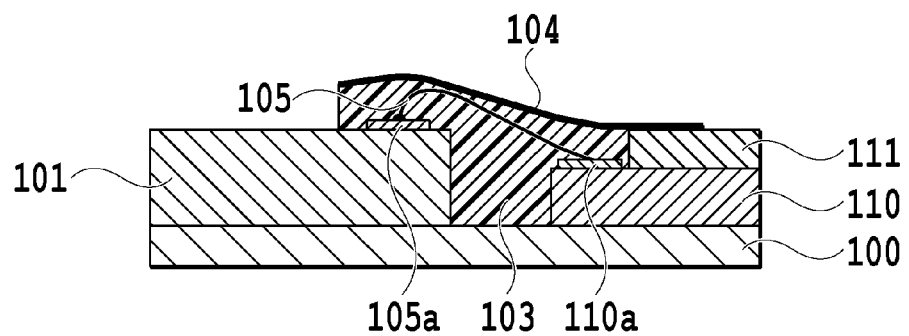
FIGS. 14A and 14B are diagrams illustrating cross-sections along the lines A-A and B-B in FIG. 13B, respectively.
Figure 14B:
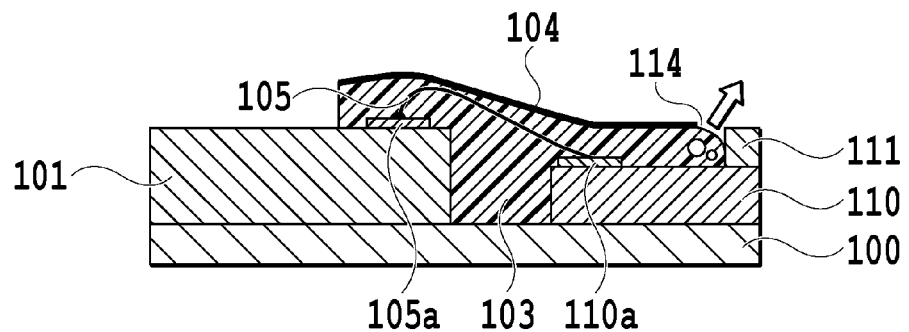

FIGS. 14A and 14B are diagrams illustrating cross-sections along the lines A-A and B-B in FIG. 13B, respectively. As illustrated in FIG. 14A, in the part of the second layer 111 of the wiring board where the recessed part 114 does not exist, the sealing resin 103 fills the enclosed space covered by the film 104 overhead between the wire 105 and the wiring board 111. Meanwhile, as illustrated in FIG. 14B, in the part where the recessed part exists, an opening is formed by the recessed part above the part adjacent to the second layer second layer 111 of the wiring board. Because of the existence of this opening, similarly to the ninth embodiment, air bubbles caught underneath the film 104 as the sealing resin flows and cures are discharged through the opening. As a result, it is possible to inhibit the mixing of air bubbles into the sealing resin underneath the film 104. Additionally, it is also possible to obtain a liquid ejecting head with a precisely positioned film 104 applied thereto, similarly to the foregoing embodiments.

(Eleventh Embodiment)

Figure 15:
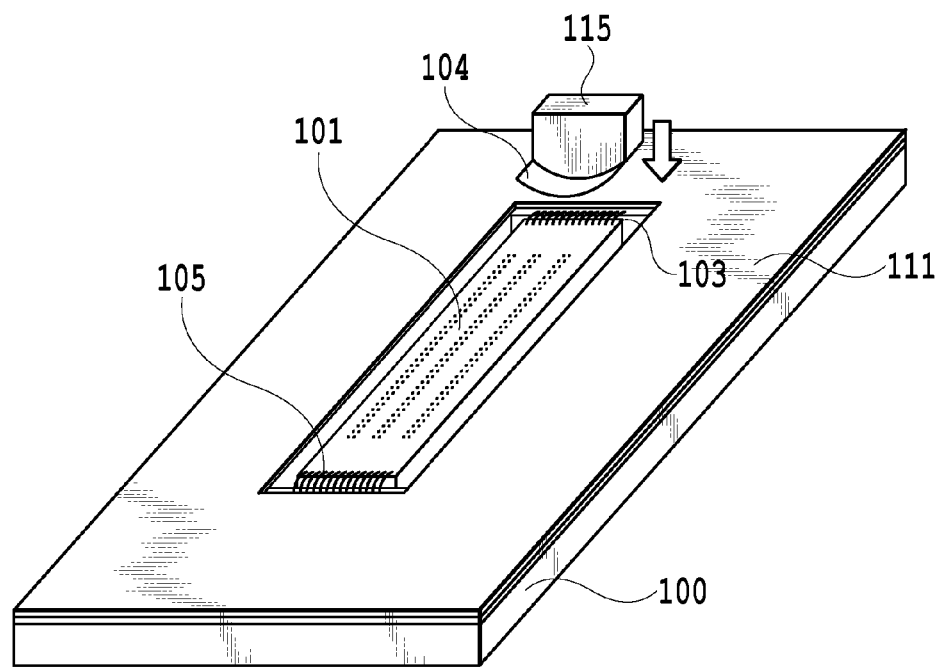
FIG. 15 is a perspective view illustrating a configuration of a liquid ejecting head according to the eleventh embodiment of the present invention.

FIG. 15 is a perspective view illustrating a configuration of a liquid ejecting head according to the eleventh embodiment of the present invention. The present embodiment relates to a configuration that inhibits the mixing of air bubbles into the sealing resin underneath the film by using a curved finger when attaching the film.

Figure 16A:
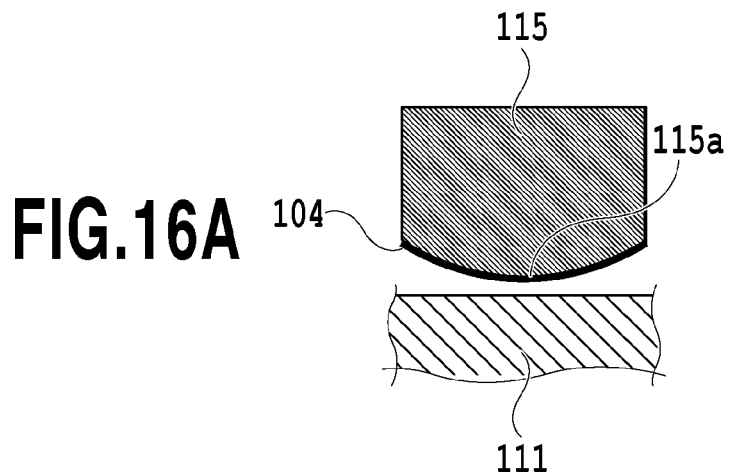
FIGS. 16A to 16C are diagrams illustrating a process of applying a film to a wiring board using a finger of the eleventh embodiment.
Figure 16B:
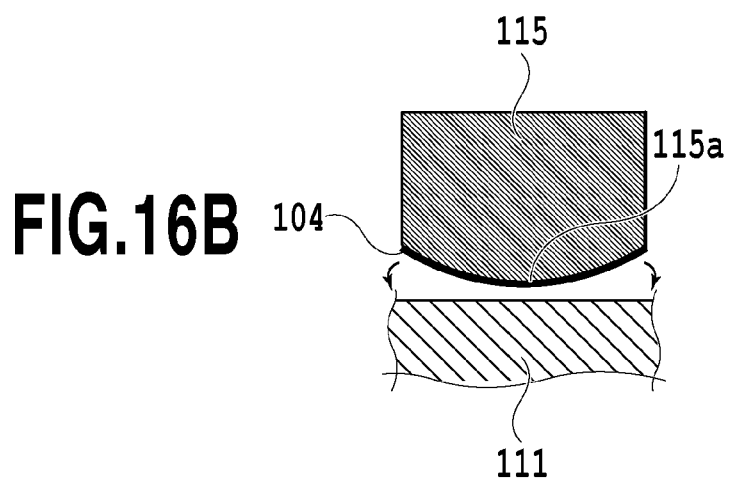
Figure 16C:
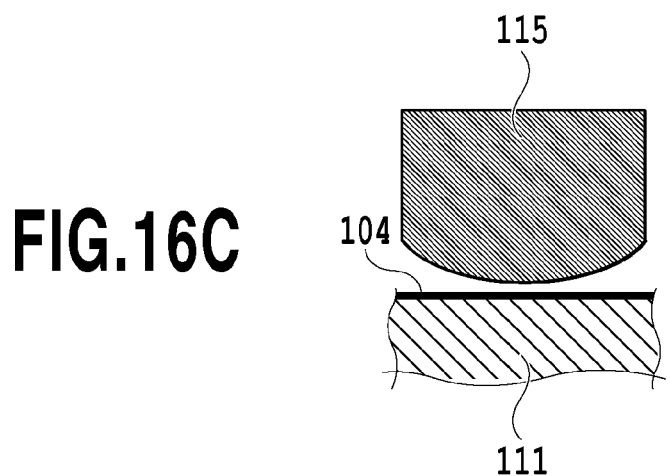

FIGS. 16A to 16C are diagrams illustrating a process of applying the film 104 to the second layer 111 of the wiring board using a finger 115 of the present embodiment.

As illustrated in FIG. 16A, a finger 115 having a curved shape is used as the finger that holds the film 104. First, the finger 115 moves downward with the film 104 fixed along the curved shape by suction, while positioning the film 104 over the second layer 111 of the wiring board. Subsequently, while maintaining the downward orientation of the finger 115, the film 104 corresponding to the apex 115a of the curve is first made to contact the second layer 111. In this case, since the finger 115 is heated, the part of the film 104 corresponding to the apex 115a of the finger 115 is fixed to the second layer 111 of the wiring board by thermo-compression. After fixing this part by thermo-compression, as illustrated in FIG. 16B, the suction of the curved finger 115 is stopped. Consequently, the film 104 moves in the directions indicated by the arrows in FIG. 16B due to gravity and the elastic force of the film 104 itself. Subsequently, as illustrated in FIG. 16C, the film 104 assumes a shape following the top face of the second layer 111 of the wiring board. The later process up to the curing of the sealing resin is similar to the fourth embodiment.

By applying the film 104 in this way, since air underneath the film 104 is pushed outward toward the ends of the film 104, the quantity of air between the film 104 and the wire 105 may be reduced, and as a result, the quantity of air bubbles mixed into the sealing resin may be minimized. Note that the part where the film 104 is thermo-compressed to the second layer 111 of the wiring board is only the central part of the film 104 in FIG. 16C. However, in the later heating step, the film 104 bonds to the liquid sealing resin 103.

Also, in the present embodiment, the film 104 is fixed by suction to a curved finger 115 to make a semicircular shape, but any other method may be used to apply the film 104 in a semicircular shape. For example, the film 104 may be made into a semicircular shape by holding only the central part of the film 104 by suction, and directly grasping the ends of the film 104.

In this way, it is possible to obtain a liquid ejecting heat with a precisely positioned film 104 applied thereto, and without leaving air bubbles underneath the film 104.

(Other Embodiments)

In the foregoing embodiments, a film is held by a finger, and after fixing the held finger to a wiring board or a support member, the rest of the film besides the fixed part is made to cover wires or leads. However, the application of the present invention is not limited to such a processing sequence. In other words, conversely, in a state in which the film is held by a finger, the wires or leads may be covered first by the rest of the film other than the part of the film being held. Such a process enables the position (height) of the finger with respect to the wires or the like to be adjusted, for example. Subsequently, after covering, the film held by the finger is fixed to the wiring board or the like.

Likewise with this configuration, even if sealing resin underneath the film flows while covering the wires with the film, since part of the film is being held by the finger, shifting of the position of the film due to the flow of the sealing resin may be minimized, and the film may be applied with high positional precision.

Although the foregoing embodiments describe an example of moving the finger to a member such as the printing element substrate 101 or the wiring board 102, the present invention is not limited thereto, and it is sufficient for both to move relative to each other. In other words, the member may be moved to the finger, or both may be moved together.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-018675, filed Feb. 3, 2014, which is hereby incorporated by reference herein in its entirety.

What is claimed is:

1. A method of manufacturing a liquid ejecting head for ejecting a liquid, the method comprising the steps of:
   preparing a member that includes a printing element substrate provided with ejection openings for ejecting liquid, a wiring board provided with an electrical wiring, and an electrical connection for electrically connecting the printing element substrate and the wiring board;
   supplying a sealant to a region between the printing element substrate and the wiring board that includes the electrical connection;
   fixing a first part of a film to a part of the member with a holding member holding the film; and
   covering the electrical connection with the film.

2. The method according to claim 1, wherein the covering step is executed after the fixing step is executed.

3. The method according to claim 1, wherein the fixing step is executed after the covering step is executed.

4. The method according to claim 1, wherein the first part of the film is fixed to a part of the wiring board.

5. The method according to claim 1, wherein:
   the member further comprises a support member that supports the printing element substrate; and
   the first part of the film is fixed to a part of the support member.

6. The method according to claim 1, wherein:
   the film includes first parts, which are a plurality of the first part; and
   a portion of the film interposed between the first parts is not fixed to the member.

7. The method according to claim 6, wherein a part of the film interposed between the first parts forms a cutout.

8. The method according to claim 6, wherein a part of the member interposed between the first parts forms a recessed shape.

9. The method according to claim 1, wherein in the fixing step, a central line portion of the film is fixed to the member.

10. The method according to claim 1, wherein the film is made of a polyolefin that at least includes a modified polyolefin.

11. The method according to claim 1, wherein:
    the film is formed on a member different from the film; and
    in the fixing step, the film is fixed by compression via the different member, and the different member is peeled off later.

12. The method according to claim 1, wherein in the fixing step, the film is held by compression with the holding member that includes a suction mechanism, and the film is thermo-compressed to the member with heat from the holding member.

13. The method according to claim 1, wherein in the fixing step, the film is held by compression with the holding member that includes a suction mechanism, and the film is thermo-compressed to the member with heat from the member.

14. The method according to claim 10, wherein the modified polyolefin is acid-modified polypropylene.

15. The method according to claim 10, wherein:
    the film is formed on a different member having a higher melting temperature than the polyolefin; and
    in the fixing step, the film is fixed by compression via the separate member, and the different member is subsequently peeled off.

16. The method according to claim 1, wherein:
a projection is formed on top of the member; and
in the fixing step, the projection engages with the film.

17. A liquid ejecting head, manufactured by the method according to claim 1.

18. The method according to claim 1, wherein in the fixing step, the holding member holds a part of the film.

19. The method according to claim 18, wherein the part of the film is a reverse side of the first part of the film.

20. The method according to claim 18, wherein the part of the film is a reverse side of another part of the first part of the film.

* * * * *